US006618422B2

(12) United States Patent
Bragin et al.

(10) Patent No.: US 6,618,422 B2
(45) Date of Patent: Sep. 9, 2003

(54) PREIONIZATION ARRANGEMENT FOR A GAS LASER

(75) Inventors: Igor Bragin, Göttingen (DE); Ulrich Rebhan, Göttingen (DE); Uwe Stamm, Göttingen (DE); Dirk Basting, Landeldale, FL (US)

(73) Assignee: Lambda Physik AG, Goettingen (DE)

( * ) Notice: Subject to any disclaimer, the term of this patent is extended or adjusted under 35 U.S.C. 154(b) by 0 days.

(21) Appl. No.: 09/863,931

(22) Filed: May 22, 2001

(65) Prior Publication Data

US 2001/0036216 A1 Nov. 1, 2001

Related U.S. Application Data

(62) Division of application No. 09/247,887, filed on Feb. 10, 1999.

(51) Int. Cl.[7] .............................. H01S 3/00; H01S 3/22; H01S 3/03; H01S 3/097
(52) U.S. Cl. ............................ 372/86; 372/55; 372/65; 372/82; 372/87; 372/88; 372/38.05
(58) Field of Search ............................... 372/55, 86, 82, 372/65, 88, 87, 38.05

(56) References Cited

U.S. PATENT DOCUMENTS

| 4,105,952 A | 8/1978 | Tulip ................... 331/94.5 PE |
| 4,240,044 A | 12/1980 | Fahlen et al. ......... 331/94.5 PE |
| 4,287,483 A | 9/1981 | Rudko et al. .............. 331/94.5 |

(List continued on next page.)

FOREIGN PATENT DOCUMENTS

| DE | 2050 490 | 4/1972 | ............ D01H/1/10 |
| DE | 29 32 781 | 2/1981 | ............ H01S/3/097 |
| DE | 30 35 730 A1 | 5/1982 | ............. H01S/3/03 |
| DE | 30 35730 A1 | 5/1982 | ............. H01S/3/03 |
| DE | 33 13811 A1 | 10/1984 | ............ H01S/3/097 |
| DE | 295 21572 U1 | 11/1997 | ............ H01S/3/038 |
| EP | 0 532 751 A1 | 2/1991 | |
| EP | 0 426 993 B1 | 12/1993 | ............ H01S/3/038 |
| EP | 1 075 059 A1 | 2/2001 | ......... H01S/3/0971 |
| EP | 1 107 401 A1 | 6/2001 | ............ H01S/3/038 |
| JP | 63-86593 | 4/1988 | ............ H01S/3/134 |
| JP | 3-9582 | 6/1989 | |

OTHER PUBLICATIONS

Raymond A. DeCarlo, Pen–Min Lin, Linear Circuit Analysis, chapter 9, pp.258, 1995.*
A.S. Bashkin, et al., "High Power 1 μsec Ultraviolet Radiation Source for Pumping of Gas Lasers," *Sov. J. of Quantum Electronics*, vol. 6, No. 8, Aug. 1976, pp. 994–996.
K. Hohla, et al., "CIF and F2: Two–ultraviolet Laser Systems," *Optics and Laser Technology*, Dec. 1979, vol. 11, No. 6., pp. 281–328.

(List continued on next page.)

*Primary Examiner*—Paul Ip
*Assistant Examiner*—Armando Rodriguez
(74) *Attorney, Agent, or Firm*—Stallman & Pollpock LLP

(57) ABSTRACT

A preionization device for a gas laser comprises an internal preionization electrode having a dielectric housing around it and an external preionization electrode displaced from the dielectric housing by a small gap. The dielectric housing includes two cylindrical regions of differing outer radii of curvature. An open end of the housing has a larger radius of curvature than the other end which is closed. The internal electrode connects to circuitry external to the discharge chamber via a conductive feedthrough which penetrates through the housing. The external circuitry prevents voltage oscillations caused by residual energy stored as capacitance in the dielectric housing. The external preionization electrode, which is connected electrically to one of the main discharge electrodes, is formed to shield the internal preionization electrode from the other main discharge electrode to prevent arcing therebetween. The external electrode is also formed to shield the outer gas volume and walls of the discharge chamber from the preionization unit. A semitransparent external electrode prevents charged particles emanating from the main discharge area from settling on the housing and causing field distortion and discharge instabilities.

24 Claims, 4 Drawing Sheets

U.S. PATENT DOCUMENTS

| | | | |
|---|---|---|---|
| 4,365,337 A | 12/1982 | Cirkey et al. | 372/87 |
| 4,380,079 A | 4/1983 | Cohn et al. | 372/87 |
| 4,429,392 A | 1/1984 | Yoshida et al. | 372/9 |
| 4,491,949 A | 1/1985 | Beck et al. | 372/86 |
| 4,498,183 A | 2/1985 | Levatter | 372/86 |
| 4,507,266 A * | 3/1985 | Satoh et al. | 422/186.15 |
| 4,542,529 A | 9/1985 | Pace et al. | 372/86 |
| 4,613,971 A | 9/1986 | Brumme et al. | 372/87 |
| 4,679,203 A | 7/1987 | Taylor et al. | 372/86 |
| 4,718,072 A | 1/1988 | Marchetti et al. | 372/86 |
| 4,719,637 A | 1/1988 | Cavaioli et al. | 372/59 |
| 4,823,354 A | 4/1989 | Znotins et al. | 372/59 |
| 4,953,174 A | 8/1990 | Eldridge et al. | 372/87 |
| 4,975,921 A * | 12/1990 | Rothe | 372/38 |
| 5,042,047 A | 8/1991 | Ono et al. | 372/86 |
| 5,048,045 A | 9/1991 | Noda et al. | 372/86 |
| 5,081,638 A | 1/1992 | Gallant et al. | 372/86 |
| 5,090,020 A | 2/1992 | Bedwell | 372/59 |
| 5,138,622 A | 8/1992 | Friede et al. | 372/38 |
| 5,138,627 A | 8/1992 | Friede et al. | 372/86 |
| 5,142,166 A | 8/1992 | Birx | 307/419 |
| 5,187,716 A | 2/1993 | Haruta et al. | 372/57 |
| 5,225,884 A | 7/1993 | Stark et al. | 356/73 |
| 5,247,391 A | 9/1993 | Gormley | 359/601 |
| 5,247,531 A | 9/1993 | Muller-Horsche | 372/38 |
| 5,247,534 A | 9/1993 | Muller-Horsche | 372/58 |
| 5,247,535 A | 9/1993 | Muller-Horsche et al. | 372/86 |
| 5,267,253 A | 11/1993 | Nakatani | 372/38 |
| 5,305,339 A | 4/1994 | Nakatani et al. | 372/38 |
| 5,309,462 A * | 5/1994 | Taylor et al. | 372/38 |
| 5,337,330 A | 8/1994 | Larson | 372/86 |
| 5,347,531 A | 9/1994 | Nakatani et al. | 372/86 |
| 5,708,676 A | 1/1998 | Minamitani et al. | 372/86 |
| 5,818,865 A | 10/1998 | Watson et al. | 372/86 |
| 5,852,621 A | 12/1998 | Sandstrom | 372/65 |
| 5,875,207 A * | 2/1999 | Osmanow | 372/86 |
| 5,897,847 A | 4/1999 | Jursich et al. | 423/219 |
| 5,923,693 A | 7/1999 | Ohmi et al. | 372/57 |
| 5,970,082 A | 10/1999 | Ershov | 372/102 |
| 5,991,324 A | 11/1999 | Knowles et al. | 372/57 |
| 6,005,880 A | 12/1999 | Basting et al. | 372/38 |
| 6,021,150 A | 2/2000 | Partio et al. | 372/57 |
| 6,023,486 A | 2/2000 | Hofmann et al. | 372/58 |
| 6,026,103 A | 2/2000 | Oliver et al. | 372/37 |
| 6,028,872 A | 2/2000 | Parlto et al. | 372/38 |
| 6,028,880 A | 2/2000 | Carlesi et al. | 372/58 |
| 6,034,978 A | 3/2000 | Ujazdowski et al. | 372/34 |
| 6,034,984 A | 3/2000 | Hofmann et al. | 372/58 |
| 6,240,110 B1 | 5/2001 | Ershov | 372/20 |
| 6,456,643 B1 | 9/2002 | Osmanow et al. | 372/86 |
| 2002/0041615 A1 | 4/2002 | Borisov et al. | 372/57 |

OTHER PUBLICATIONS

Article in Russian Language: Journal of Technical Physics, vol. 49, No. 6, pp. 1241–1244.

Lambda Physik Booklet: "Instruction for Mounting the Brewster's Window EMG 67 or Unstable Resonator kit EMG 70," printed Jan. 1982, 27 pages.

Optics and Laser, Dec. 1979, vol. 11, No. 6., pp. 281–328.

R. Marchetti et al., "A New Type of Corona—discharge Photoionization Source for Gas Lasers," Journal of Applied Physics, Dec. 31, 1985.

R.S. Taylor et al., "Pre–ionization of a Long Optical Pulse Magnetic–spike Sustainer XeCl Laser," Review of Scientific Instruments, American Institute of Physics, Dec. 1994.

Tatsuo Enami et al., "High Spectral Purity and High Durability kHz KrF Excimer Laser with Advanced RF Pre–ionization Discharge," Proceedings of SPIE, Optical Microlithography XI, Feb. 25–27, 1998, vol. 3334, pp. 1031–1040.

* cited by examiner (NOT TO SCALE WITH FIG. 6a)

(NOT TO SCALE WITH FIG. 6a)

US 6,618,422 B2

PREIONIZATION ARRANGEMENT FOR A GAS LASER

PRIORITY

This application is a divisional application which claims the benefit of priority to U.S. patent application Ser. No. 09/247,887, filed Feb. 10, 1999.

BACKGROUND OF THE INVENTION

1. Field of the Invention

The invention relates to an excimer laser pumped by an electrical gas discharge, and particularly to a preionization device and technique for generating a stable pulsed gas discharge for pumping of an active medium of an excimer laser.

2. Discussion of the Related Art

UV-preionization of the electrical discharge in a pulsed gas laser is typically realized by means of an array of spark gaps or by another source of UV-radiation (surface, barrier or corona gas discharges), disposed in the vicinity of at least one of the solid electrodes of the main discharge of the laser. Conventional pulsed electrical gas discharges typically used for pumping the active media of excimer lasers are unstable. The development of discharge instabilities cause the glow discharge, a precondition for laser emission, to have a short phase (e.g., having a typical duration from 10–100 ns) and to thus be terminated too quickly. The desired way of generating a high quality gas discharge for use in excimer lasers is to provide an intense, yet uniform preionization of the gas volume before the main gas discharge occurs. One way of providing this preionization is by photo-ionizing the laser gas with UV-light emitted from an auxiliary gas discharge before the main gas discharge is switched on. Some known methods of preionizing high pressure gas lasers include x-ray, spark and corona-gap preionization. See R. S. Taylor and K. E. Leopold, *Pre-preionization of a Long Optical Pulse Magnetic-Spiker Sustainer XeCl Laser*, Rev. Sci. Instum. 65 (12), (December 1994). The spark method involves the use of spark gaps (ordinary or stabilized by a dielectric surface), and the corona-gap method involves the use of pulsed corona-like discharges near a dielectric surface.

Areas of focus for design improvement of corona-gap preionizers include the geometry of the dielectric body, and the arrangement of the preionization electrodes. See U.S. Pat. No. 4,718,072 to Marchetti et al. (showing a grounded internal preionization electrode surrounded by a dielectric having a positive potential applied to its outer surface through contact with the positively biased main electrode); European Patent Application (published) EP 0 532 751 A1 (showing an internal preionization electrode surrounded by a dielectric buried in one of the main electrodes); U.S. Pat. No. 4,953,174 to Eldridge et al. (showing the dielectric surrounding an internal preionization electrode abutting with a main discharge electrode); see also R. Marchetti et al., *A New Type of Corona-Discharge Preionization Source for Gas Lasers*, J. Appl. Phys. 56 (11), (Dec. 1, 1984); U.S. Pat. No. 4,380,079 to Cohn et al.

Reconfiguration of external electrical circuits is another area where corona-gap pre-ionizer design improvement efforts have been focused. See Taylor et al., citation above; U.S. Pat. No. 5,247,531 to Muller-Horsche (showing an excitation of preionization electrodes affected by the same high voltage source as the main discharge electrodes including a time delay inductance between them), U.S. Pat. No. 5,247,534 to Muller-Horsche (including flow bodies configured to facilitate laser gas flow and formed of material exhibiting secondary x-ray emission characteristics) and U.S. Pat. No. 5,247,535 to Muller-Horsche (disclosing electron emission from a heated cathode, wherein x-rays emitted as the electrons impinge upon a separate anode serve to preionize the laser gas volume).

U.S. Pat. No. 5,337,330 to Larson describes the typical corona-like preionization arrangement of FIG. 1a. See also U.S. Pat. No. 5,247,391 to Gormley, and U.S. Pat. No. 4,953,174 to Eldridge et al. The discharge chamber having the preionizing device of FIG. 1a includes a high voltage main electrode 1 and a grounded main electrode 2. The preionization unit includes two internal preionization electrodes 3a each located on one side of main discharge region 5 between the main discharge electrodes 1,2. Each preionization unit includes a dielectric tube 3b of generally cylindrical shape surrounding the internal preionization electrode 3a. A preionization discharge (ultraviolet emission) 4 from the preionization electrodes 3a & 6 and dielectric tubes 3b causes a preionization of the volume of the main gas discharge. A pair of external preionization electrodes 6 of the preionization units comprise metal plates and are each directly connected to the nearby main discharge electrode 1 (e.g., the cathode at high potential).

In this case energy stored in the dielectric tubes 3b, which can be non-negligible relative to the energy of the main discharge, during a preionization phase, will also be absorbed into the main discharge 5. However, that added energy typically will not increase the laser output due to a high wave impedance of the dielectric tubes 3b. The tubes 3b act much like a charged transmission line in that this wave impedance is typically much higher than the impedance of the main gas discharge. The high wave impedance is caused by a distributed inductivity of the whole dielectric tubes 3b (as a transmission line) and a concentrated inductivity at the point of electrical connection of the tubes 3b with the internal corona discharge electrodes 3a.

The residual energy produces high voltage electrical oscillations between the capacitance of the dielectric tubes 3b of the preionization units and the main gas discharge volume. These high voltage oscillations are undesirable because they significantly reduce the ability of the dielectric tubes 3b of the preionization unit to resist direct high voltage breakdown and over-flashing near the open ends of the dielectric tubes 3b. Moreover, these oscillations deteriorate the quality of the main gas discharge 5 and thus hinder the operation of the laser, particularly during operation at a high repetition rate. Furthermore, the oscillations cause additional wear to the main gas discharge electrodes 1,2 and the internal corona discharge electrodes 3a, and also cause contamination and a reduced lifetime of the laser system.

FIG. 1b shows a conventional preionization unit setup wherein only one internal corona-discharge preionization electrode 3a is employed. See U.S. Pat. No. 4,240,044 to Fahlen et al. FIG. 2 shows a perspective view of a preionization unit of either of FIGS. 1a and 1b. The preionization unit includes the internal electrode 3a and the external electrode 6. The area of most intense discharge 4 is shown at the surface of the dielectric tube 3b nearest the external electrode 6.

Another problem with conventional corona-like preionization units is illustrated in FIG. 3. In the preionization unit of FIG. 3, an internal preionization electrode 3a is shown surrounded by a dielectric tube 3b. An external preionization electrode 6 is shown abutting the surface of the dielectric tube 3b. The dielectric tube 3b often exhibits an unsatisfactorily non-uniform surface discharge 4a in this configuration. The non-uniform surface discharge leads to instabilities such as arcing from areas of higher charge density. The lack of uniformity of surface discharge also can cause an unstable "jitter" of the laser output. This jitter is a fluctuation of the interval between successive laser pulses from an evolving instability in the ignition from one laser pulse to another. This variance, or jitter, is undesirable and makes laser performance less reproducible.

Other problems are associated with conventional corona-like preionization units such as that illustrated in FIG. 4. Some of the UV-light emanating from the outer surface of the dielectric tube 3b unit illuminates the main discharge volume 5, as is desired. However, some of the gas volume outside of the main discharge region 5 is also illuminated by the UV-light. The UV-light is preionizing a larger gas volume than is either required or desired.

A disadvantage related to this is illustrated in FIG. 4, which shows that at high repetition rate operation, arcing occurs across the gas volume between the external electrode of the preionizer 6 and the grounded main electrode 2. Arcing of this kind puts constraints on the maximum achievable repetition rate. Moreover, even before the onset of visible arcing of this kind takes place, the laser pulse energy is substantially reduced by parasitic discharges in the additionally preionized gas volume. These parasitic discharges produce an instability in the laser operation.

Moreover, as may be understood from inspection of the arrows pointing away from the tube 3b of FIG. 4, some UV-light is undesirably misdirected away from the main discharge region 5 and is absorbed by the dielectric laser chamber walls. As a result, charges build up on the walls and further inefficient arcing and parasitic discharging occurs. To address this problem, Japanese Patent Application No. 3-9582 and U.S. Pat. No. 5,337,330 to Larson each disclose a shielding element, shown as reference numerals 6 and 36, respectively, to reduce the electric field strength between the main electrode and the dielectric pipe.

SUMMARY OF THE INVENTION

It is accordingly an object of the invention to design a preionization unit for a laser having a high quality gas discharge by providing an intense, yet uniform, preionization of the gas volume between the main discharge electrodes.

It is also an object of the invention to provide a dielectric tube which prevents over-flashing and arcing at the tube ends.

It is another object of the invention to prevent electrical oscillations from arising out of residual energies stored in the dielectric tube.

It is an object of the invention to provide an external electrode which shields the walls of the discharge chamber and the gas volume outside of the main discharge area from the effects of the preionization unit.

The present invention meets these objects and addresses the shortcomings of conventional preionization techniques by providing a preionization device for a gas laser which comprises an internal preionization electrode having a dielectric tube around it and an external preionization electrode displaced from the dielectric housing by a small gap. The dielectric tube includes two cylindrical regions of differing outer radii of curvature. One end of the tube is open to allow an electrical connection to the internal electrode, and the other end is closed. The open end of the tube has a larger radius of curvature than the closed end. The internal electrode connects to circuitry external to the discharge chamber at the open end of the tube via a conductive feedthrough which penetrates through the housing. The external circuitry prevents voltage oscillations caused by residual energy stored as capacitance in the dielectric housing. The external preionization electrode, which is connected electrically to one of the main discharge electrodes, is formed to shield the internal preionization electrode from the other main discharge electrode to prevent arcing therebetween. The external electrode is also formed to shield the outer gas volume and walls of the discharge chamber from the preionization unit. A semi-transparent external electrode prevents electrical field distortion near the main gas discharge.

BRIEF DESCRIPTION OF THE DRAWINGS

FIG. 7b shows a cross-sectional side view of the discharge chamber of FIG. 7a.

DETAILED DESCRIPTION OF THE PREFERRED EMBODIMENT

Gap

Figure 1A:
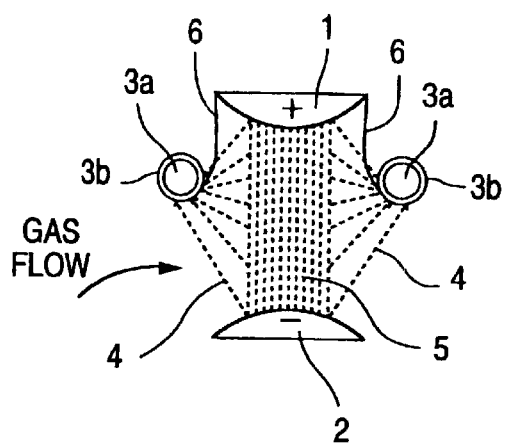
FIG. 1a shows a conventional arrangement of a discharge chamber of a high repetition rate pulsed discharge laser having two internal and external preionization electrode pairs and a UV-preionized active volume.
Figure 1B:
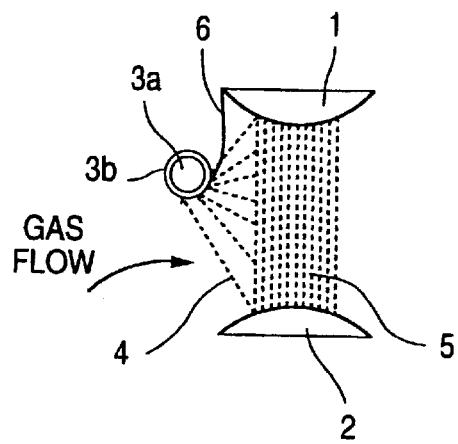
FIG. 1b shows the arrangement of FIG. 1a having instead only one internal and external electrode pair.
Figure 2:
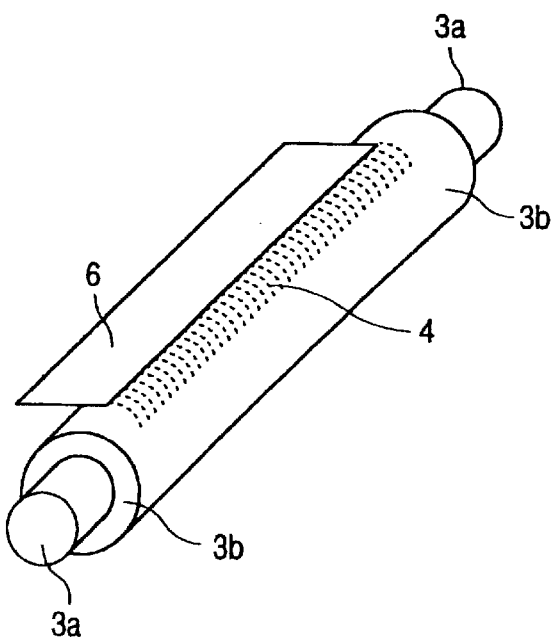
FIG. 2 shows an axial geometry of a conventional UV-preionization unit having a gas discharge stabilized by a dielectric surface.
Figure 3:
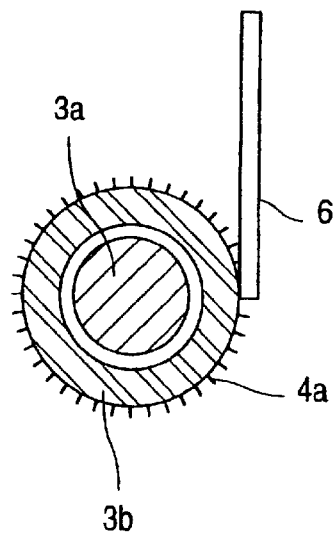
FIG. 3 shows a conventional UV-preionizer having an external electrode abutting the dielectric tube surrounding the internal electrode.
Figure 5:
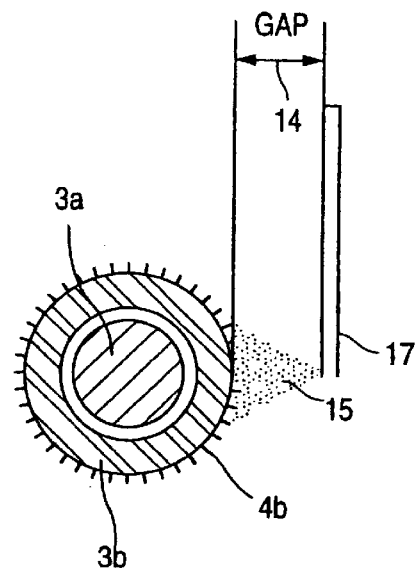
FIG. 5 shows a UV-preionizer in accord with the present invention wherein a gap exists between the external electrode and the dielectric tube surrounding the internal electrode.

FIG. 5 shows a UV-preionizer in accord with the present invention wherein a gap 14 exists between the external electrode 17 and the dielectric tube 3b surrounding the internal electrode 3a. The preionizer configuration of FIG. 5 differs from the conventional preionizer configuration shown in FIG. 3 because that of FIG. 3 does not include the gap 14. The size of the gap is preferably in a range from 10 to 200 microns.

The small additional gap 14 between the external electrode 17 of the preionizer and the outer surface of the dielectric tube 3b surrounding the internal electrode 3a produces an area 15 of intense barrier discharge, causing the surface of the dielectric tube 4b to be illuminated with UV radiation substantially uniformly along its length. The gap 14 between the tube 3b and the external electrode 17 significantly improves laser performance and produces a more uniform preionizing surface discharge 4b than the surface discharge 4a produced using the conventional arrangement of FIG. 3. Weak plasmas of the barrier discharge area 15 fill the gap 14 during the initial formation phase of the preionization discharge and illuminate the surface of the dielectric tubes, advantageously facilitating the development of a uniform surface discharge 4b over the tube 3b.

Also advantageously, this UV illumination reduces the above-described jitter, further stabilizing the surface corona discharge 4b. That is, when the gap 14 is introduced in accord with the present invention, the fluctuation in time periods between pulses described above is significantly reduced. The preionization unit efficiency and overall laser performance are enhanced because this pulse interval is more uniform.

Dielectric Tube

Figure 6A:
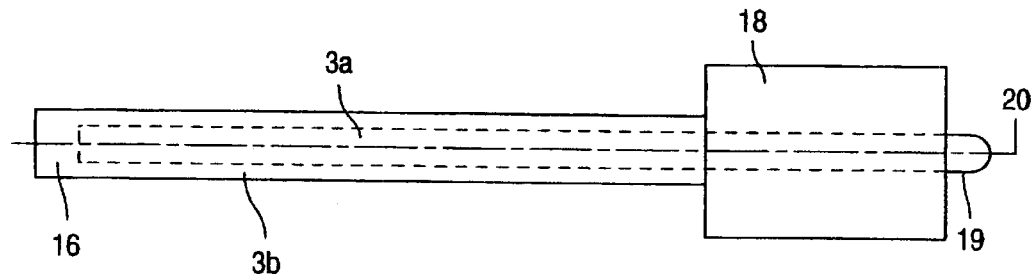
FIG. 6a shows a side view of a preferred embodiment of the dielectric tube surrounding the internal electrode of the UV-preionizer of the present invention.
Figure 6B:
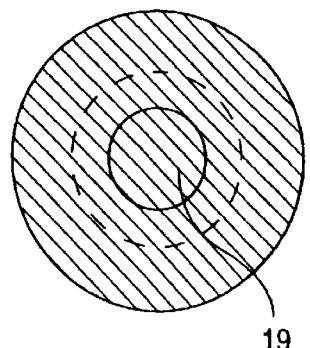
FIG. 6b shows an end view of the tube of FIG. 6a looking toward the open end of the tube.
Figure 6C:
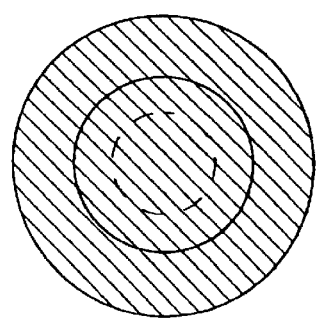
FIG. 6c shows an end view of the tube of FIG. 6a looking toward the closed end of the tube.

FIGS. 6a–6c show a configuration of a dielectric tube 3b surrounding an internal electrode 3a of a UV-preionizer unit in accord with the present invention. FIG. 6a shows a side view of the preferred tube 3b. The dielectric tube 3b comprises a material suitable for use inside a laser gas mixture which includes an aggressive halogen (e.g., fluorine). The material of the tube 3b is also capable of sustaining a capacitively coupled gas discharge. That is, the material has sufficient dielectric strength to support an intense surface electrical gas discharge. For this reason, the preferred dielectric tube 3b comprises a ceramic such as $Al_2O_3$. The crystalline form (also known as sapphire), as well as the polycrystalline form, of $Al_2O_3$ may be used.

Dielectric tube preionizers must have reliable protection against electrical over-flashing from the external electrodes (not shown in FIGS. 6a–6c) to the internal electrodes 3a at each of the two ends 16,18 of the dielectric tube 3b. This over-flashing, or direct corona discharging between the internal electrode 3a and the external electrode 17, is undesirable because such discharging can terminate the preionizing corona discharge along the dielectric tube 3b, and trigger severe arcing at the tube ends 16,18 resulting in possible damage or destruction of the dielectric tube 3b due to increased energy dissipation.

For at least this reason, the present invention provides an advantageous dielectric tube 3b having a closed end 16 and an open end 18. FIG. 6b shows an end view of the dielectric tube 3b looking toward the open end 18 of the tube 3b. FIG. 6c shows an end view of the tube 3b looking toward the closed end 16 of the tube 3b.

The closure of the dielectric tube 3b serves to electrically insulate the internal preionization electrode 3a at the closed end 16 and prevent direct flashing-over at that end 16. The end 16 is preferably closed with the same dielectric material as the length of tube 3b comprises. In this way, there is no undesirable change in dielectric strength at the closed end 16 which might otherwise be caused by a change in dielectric constant. Changes in dielectric constant and strength along the tube 3b are advantageously avoided in the present invention to enhance uniformity and preionization efficiency.

The tube 3b of the present invention, being comprised of ceramic and having a closed end 16, is advantageous for the additional reason that it is easily manufacturable. A tube 3b comprising crystalline $Al_2O_3$, or sapphire, e.g., and open at both ends is preferably grown in a first step, and then one end is closed in a second step. The crystal orientation in the entire tube 3b including the closed end 16 may be controlled to provide a tube 3b having excellent dielectric homogeneity and strength.

A tube 3b having a closed end 16 in accord with the present invention may have a shorter length than conventional dielectric preionizer tubes without enhanced arcing from the internal electrode 3a at the closed end 16 because the internal electrode 3a is fully insulated at the closed end 16 by the dielectric tube 3b. This length reduction is advantageous because the length of the preionizer tube 3b is a constraint on the minimum length of the laser tube (not shown) itself. For example, the ratio of the length $l_a$ of the laser active gain volume to the total length $l_t$ of the laser tube becomes closer to unity as the length of the preionizer tube 3b is coincidentally increased. Generally, the larger the ratio $l_a/l_t$ becomes, the more efficient the laser system itself becomes. This is especially the case for frequency narrowed high repetition rate lasers. For example:

$l_a/l_t \approx 0.55$ if preionizers with open ends are used; and $l_a/l_t \approx 0.75$ if preionizers with one closed and one open end are used.

Only one end 16 of the tube 3b can be closed because the internal electrode 3a must be connected to a defined external potential or a pulse generator. The open end 18 thus has the opening 19 as shown in FIGS. 6a–6c. Each of the surface corona intensity and flashing-over probability depends significantly on the specific capacity (or capacitance) of the dielectric tube 3b. In turn, the specific capacity is approximately inversely proportional to the logarithm of the ratio of external-to-internal dielectric tube diameters. Thus, an increase in the external-to-internal dielectric tube diameter ratio generally causes a reduction of both the surface corona intensity and the flashing-over probability. Therefore, as shown in FIG. 6a, the present invention provides a larger external diameter of the dielectric tube 3b at the open end 18 to provide a smaller capacitance at the open end 18. The optimum external diameter and length of the tube 3b at the open end 18 depends on several factors including the overall geometric design of the laser, applied voltages, timing of voltage pulses, and the laser gas mixture. Some exemplary data include the following:

internal diameter of dielectric tube 3b: 1 to 6 mm external diameter of tube 3b at closed end 16: 6 to 10 mm external diameter of tube 3b at open end 18: 20 to 30 mm length of open end having larger external diameter: 50 to 75 mm total length of tube 3b: 0.5 to 1.0 m.

The external diameter of the tube 3b at the open end 18 is constrained by the proximity of the anodic main electrode (not shown in FIGS. 6a–6c), and the probability of cascade electrical breakdown from the tube 3b to ground. A tube 3b having two length portions of differing external diameters and homogeneous dielectric properties, such as the preferred embodiment of the present invention, may be manufactured using a two step growing process. The first step forms the first length with the first external diameter and the second step forms the second length with the second external diameter. A third step may include forming the closed end 16.

Figure 6D:
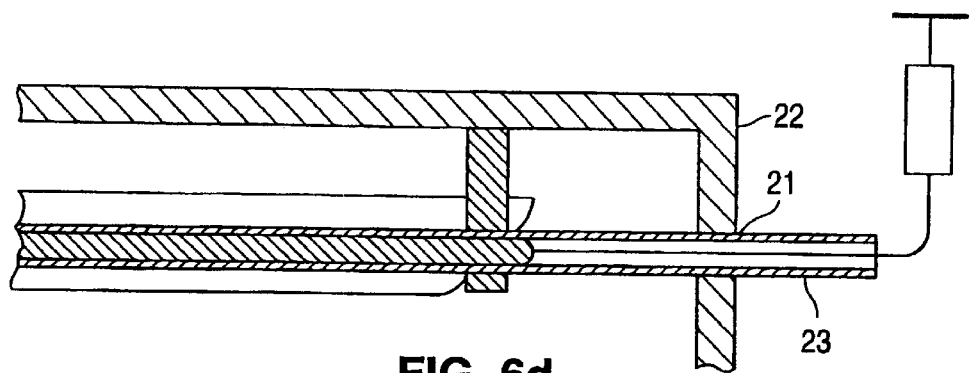
FIG. 6d shows a side view of an alternative embodiment wherein the dielectric tube is fed through an opening in the wall of the discharge chamber.

Instead of having a "thick" open end 18, the dielectric tube 3b may alternatively be used as a feedthrough. That is, the tube 3b may be sealably fed through an opening 21 in the dielectric wall 22 of the laser discharge chamber, as shown in FIG. 6d. In this alternative embodiment, the internal electrode 3a within the feedthrough tube 3b of the preionizer unit is easily connectable to an external potential or pulse generator. That portion 23 of the tube 3b where a surface corona discharge might start is now located external to the laser chamber. Advantageously, the surface corona intensity is strongly reduced in this case because the onset for a corona discharge is much lower in air compared to the laser gas mixture. Moreover, the length of the tube 3b required for reliable prevention of overflashing is about 3 to 5 times shorter in air than in the laser gas mixture. The total length of the laser tube may thus be reduced.

Returning to the preferred embodiment shown in FIGS. 6a–6c, the internal electrode 3a preferably connects with an external electrical potential (not shown) at a connection point 20 at the very end of the internal electrode 3a which is shown protruding from the open end 18 of the tube 3b. The enhanced thickness of the wall of the tube 3b at the open end 18 allows an external electrical potential to be applied to the internal electrode 3a of the preionizer at the connection point 20 with a reduced risk of "flashing over" from the internal electrode 3a.

The internal electrode 3a of the preionizer preferably substantially fills the entire internal space of the dielectric tube 3b during operation to facilitate strong capacitive coupling between the preionization discharge and the internal electrode 3a. This is because any space between the internal electrode 3a and the dielectric tube 3b should be kept to a minimum. Only a small spacing should be provided to allow for any enhanced thermal expansion rate that the internal electrode 3a may exhibit over the dielectric tube 3b during operation.

The internal electrode preferably comprises a metal tube or a solid metal rod. A thin walled flexible metal tube having a small longitudinal slit along the length of the tube may also be used. This latter "slit" design provides the above-described small spacing between the internal electrode 3a and dielectric tube 3b wherein a thermally induced mechanical stress to the dielectric tube is minimized. The slit provides the expansion space for the metal internal electrode 3a. The internal electrode may also comprise a conductive liquid.

Feedthroughs

Figure 7A:
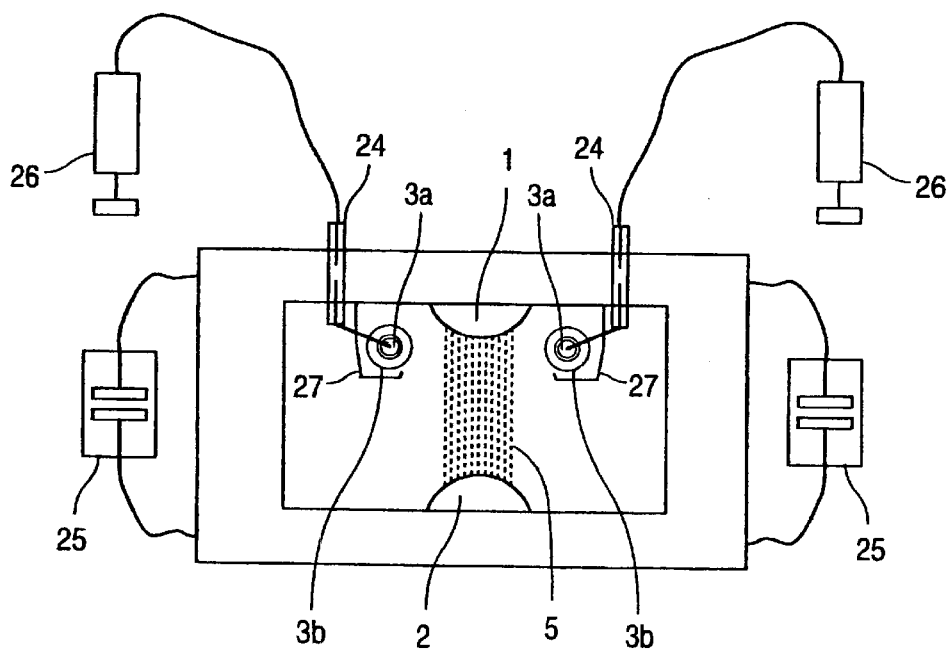
FIG. 7a shows a cross-sectional axial view of a discharge chamber of a gas discharge laser in accord with the present invention.
Figure 7B:
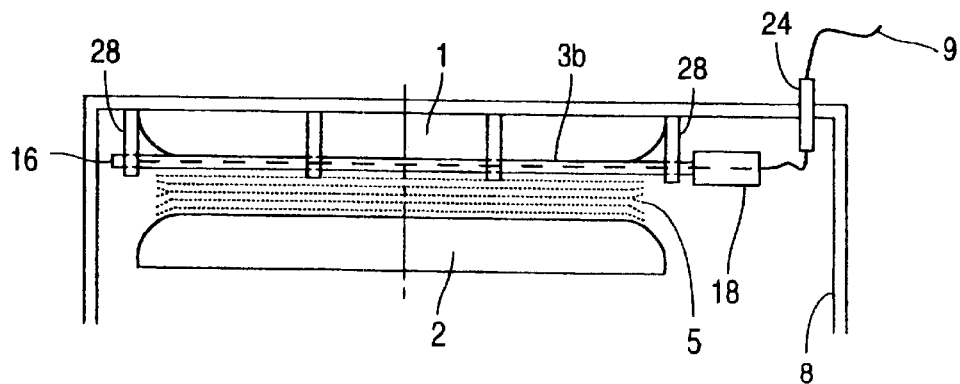

FIGS. 7A and 7B show an axial cross-sectional view and a side cross-sectional view, respectively, of a laser discharge chamber in accord with the present invention. The main discharge electrodes 1,2 are mutually opposed along the top and bottom of the discharge chamber, respectively. Two preionizer units are shown having internal electrodes 3a and external electrodes 3b. The main discharge area 5 is between the main electrodes 1,2. A pair of external electrodes 27 are shown connected to the top main electrode 1, which is preferably the cathode, or high potential, main electrode 1. Feedthroughs 24 sealably penetrate the discharge chamber from the outside, and advantageously allow external circuitry 26 (external to the discharge chamber) to be connected to the internal electrodes 3a of the preionizer units. A set of peaking capacitors 25 is also shown. The peaking capacitors are used for electrical pumping of the main discharge. Their values depend on the discharge and the configuration of the gas mixture and is usually in a range from around 5 nF to around 50 nF.

The internal electrodes 3a of the preionizer unit are conventionally connected directly to the second main discharge electrode 2, which is the anode at ground potential. This conventional approach, however, allows an undamped electrical oscillation to arise out of residual energy stored in the dielectric tube 3b. For this reason, each internal electrode 3a of the preionizer unit of the preferred embodiment of the present invention is connected to auxiliary circuitry 26 located external to the discharge chamber via the feedthrough 24. This auxiliary circuitry 26 is preferably a resistor connected to ground potential. The resistor of the auxiliary circuitry 26 has a resistance value comparable to or larger than a wave impedance of an oscillating contour of the preionizer. A typical wave impedance value for a preionizer unit is $R_w = (L/C)^{0.5} = 8$ to $15\Omega$. A preferred resistance value of the resistor is then $R = 30$ to $70\Omega$. Although the resistors of the external circuitry 26 play no significant role during the preionization phase, they do serve to significantly damp the oscillations of the preionizer after the preionization phase. The reduction or prevention of these undesirable voltage oscillations enhances the reliability and increases the lifetime of the preionizer unit.

The external electrical circuitry 26 may include more complex passive and/or active electrical components. This external circuitry 26 connected to the internal electrodes 3a may provide electrical pulses of desired shape and periodicity. It is the feedthroughs 24 which provide the connection of the internal electrodes 3a to these or any of a wide variety of other useful external electrical devices 26.

FIG. 7B shows how the preionizers are fixed into position within the gas discharge chamber according to a preferred embodiment of the present invention. Several holders 28 spaced along the length of the preionizer tube 3b suspend the tube 3b within the discharge chamber. The number of these holders 28 depends on the size and composition of the preionizer unit.

At least one holder 28 fastens each end of the tube 3b and additional intermediate holders 28 may be used. Use of these holders provides design flexibility such that the small gap 14 of preferably 10–200 µm shown in FIG. 5 between the external electrodes 27 of the preionization units and the dielectric tubes 3b. The holders 28 of the dielectric tubes are preferably made of a dielectric material (for example ceramics) to avoid disturbances of the electrical field by the holders 28.

External Electrode Configuration

Preionization involves a gas discharge near the surface of the dielectric tubes 3b. This gas discharge is supported by capacitive coupling between the internal electrodes 3a and the external electrodes 27. The internal electrodes 3a and the external electrodes 27 are so named because of their positions inside and outside of the dielectric tube 3b, respectively.

Figure 4:
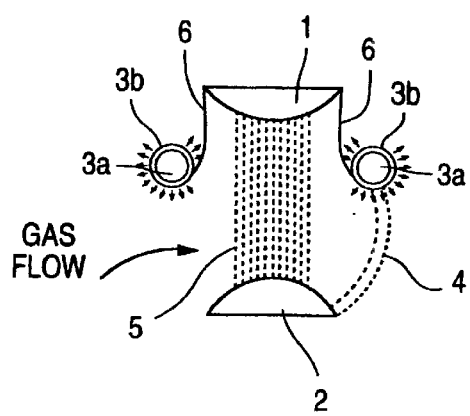
FIG. 4 shows a UV-preionizer arrangement having conventional external electrodes.
Figure 8:
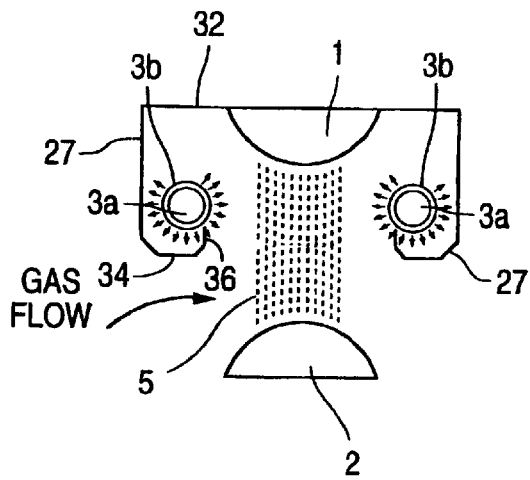
FIG. 8 shows a UV-preionizer arrangement configured with external electrodes in accord with the present invention.

A typical problem which arises during the operation of pulsed gas discharge lasers at high repetition rates is arcing 4, as illustrated in FIG. 4. Referring to FIG. 8, the performance of a gas discharge laser in accord with the preferred embodiment of the present invention is improved at high repetition rates because its external electrodes 27 are especially designed to prevent or reduce this arcing 4.

The external electrodes 27 shown in FIG. 8 are connected to the main discharge electrode 1 and are made from a conducting material such as thin sheet metal or metal foil preferably having a thickness in the range from 50 to 500 μm. From the main discharge electrode 1, each external electrode 27 is formed to approach the tube 3b on a path over the top and around the outside of its associated tube 3b containing the internal electrode 3a. Preferably, no portion of the external preionization electrode 27 lies between the dielectric tube 3b and the first main discharge electrode 1. The external electrode 27 is preferably shaped such that it surrounds the dielectric tube 3b and opens to the main discharge area 5 between the first main discharge electrode 1 and the second main discharge electrode 2. The external electrode 27 preferably is interposed between the dielectric tube 3b and the adjacent chamber wall(s) the isolate the adjacent chamber wall(s).

Preferably, the external electrode has a portion 32 which runs horizontally away from the main electrode 1 above the tube 3b. Another portion 34 beneath the tube 3b and opposite the first portion 32 has an end 36 which is bent toward the tube 3b. This bent end 36 is preferably spaced from the tube 3b by a constant gap along the length of the tube 3b.

The external electrodes 27 of the preionizer of the present invention are designed in the above way with many advantages. The external electrodes 27 shield the tube 3b from the second main discharge electrode 2. This shielding reduces or prevents the arcing 4 shown in FIG. 4 and results in superior performance. The arcing is reduced or prevented because the gas volume outside of the main discharge area 5, and particularly near the walls of the gas discharge chamber where downstream arcing 4 usually develops, is not preionized due to the shielding effect of the external electrode 27.

Advantageously, the design of the external electrodes 27 of the present invention provides an enhanced illumination of the main gas discharge volume because it is not undesirably screened by the external electrodes 27 as in the prior art (see FIG. 4). The design of the external electrode 27 of the present invention also makes it possible to achieve higher a repetition rate during operation without having to increase gas flow velocity between the main electrodes 1,2.

The external electrodes 27 are generally shorter than their corresponding dielectric tubes 3b. The ends of conventional external electrodes 6 also typically are quite sharp, having radii of curvature from 25 to 250 μm. This results in an enhancement of local electrical field strength around the ends of conventional external electrodes. Consequently, the probability of arcing occurring between a conventional internal electrode 3a and a conventional external electrode 6 is undesirably high. Enhancement of the local electrical field also increases electrical stress of the dielectric tube 3b and reduces its reliability.

Figure 9:
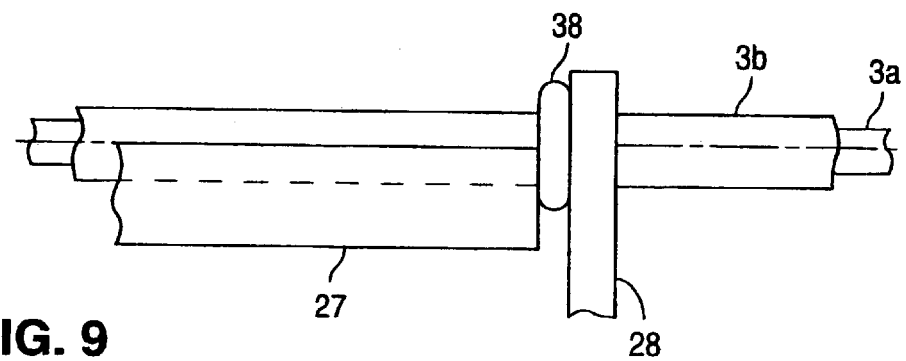
FIG. 9 shows a preionization unit wherein a metal ring is provided at the end of the external electrode in accord with the present invention.

This field strength enhancement is avoided in the preferred embodiment of the present invention because the radius r of the ends of the external electrodes 27 is increased. A preferred way of achieving this enhanced radius is by providing a metal ring 38 at the ends of the external electrodes 27, as illustrated in FIG. 9. The inner diameters $d_i$ of the rings 38 preferably approximately equal the outside diameter of the dielectric tube 3b. The outside diameter $d_a$ of the rings 38 is thus significantly larger than the diameter of the dielectric tube 3b. The radius of curvature r of the outer surface of the rings 38 is computed as $r=(d_a-d_i)/4$.

Typical values are:
$d_i$=6 to 10 mm;
$d_a$=10 to 15 mm;
r=1 to 2 mm,
and the radius of curvature r is sufficient to prevent arcing from the ends of the external electrodes 27.

Semi-transparent External Electrode

Figure 10:
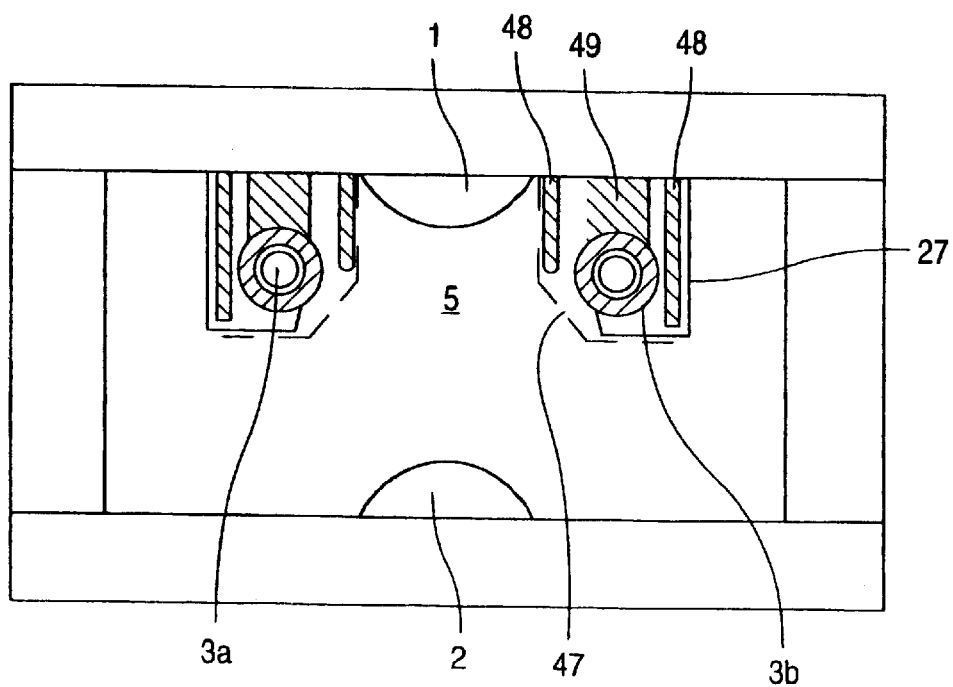
FIG. 10 shows a cross-sectional axial view of a preionizer arrangement including a semi-transparent external electrode in accord with the present invention.

The electric field between the main discharge electrodes 1,2 of a conventional corona type preionizer arrangement is distorted by large intrinsic gradients caused by the electrical field of the preionizer unit. The surface discharge over the tube 3b causes this distortion of the electrical field in the area of the main discharge. That distortion is reduced by the modified nature of the external electrodes 27 of the present invention shown in FIG. 10 due to a semitransparent electrode 47 which better shields the preionizer field from the main discharge area 5 and grounded main electrode 2. That reduction in distortion results in more stable laser operation, especially at high repetition rates.

The semi-transparent electrode 47 preferably at least partially comprises a wire mesh or a perforated foil. The semi-transparent electrode 47 partially covers the preionizer unit, shielding the main discharge area 5 from fields of the preionizer unit and preventing electric field distortion there. The preferred arrangement shown in FIG. 10 includes support elements 48 and 49. Support element 48 supports the external electrode and preferably comprises a metal or other conductor. Support element 49 supports the dielectric tube 3b and preferably comprises a ceramic or other insulator with appropriate dielectric properties.

The objects of the invention set forth above are thus met. The gap 14 between the external electrode 27 and the dielectric tube 3b (see FIG. 5) provides a high quality gas discharge by providing an intense, yet uniform, preionization of the gas volume between the main discharge electrodes. The gap 14 allows the surface 4b of the dielectric tube 3b to be uniformly illuminated with UV-radiation along its length. The design of the dielectric tube 3b having an open end 18 and a closed end 16, wherein the open end 18 has an increased external radius reduces over-flashing and arcing at each of the tube ends 16,18. Electrical oscillations arising out of residual energies stored in the dielectric tube are avoided by connecting the internal electrodes to external circuitry via the feedthroughs 24. The design of the external electrodes 27 shield the walls of the discharge chamber and the gas volume outside of the main discharge area 5 from the effects of the preionization unit, and provides an enhanced illumination of the main discharge area. The semi-transparent electrode 47 reduces distortion of the electrical field in the area of the main discharge 5.

Those skilled in the art will appreciate that the just-disclosed preferred embodiments are subject to numerous adaptations and modifications without departing from the scope and spirit of the invention. Therefore, it is to be understood that, within the scope of the appended claims, the invention may be practiced other than as specifically described above.

What is claimed is:

1. A discharge chamber for a gas arc-discharge laser, comprising:
    a housing configured to hold a laser gas mixture;
    a pair of opposed main arc-discharge electrodes within said housing defining a main arc-discharge region;
    a set of peaking capacitors connected to at least one of the main arc-discharge electrodes for electrical pumping by arc discharge of the main arc-discharge region;

a corona-type preionization unit within said housing, the preionization unit and said one of the main arc-discharge electrodes are each coupled to said set of peaking capacitors which power both a main arc-discharge and a preionization discharge; and an electric circuit external to said housing and electrically connected to an electrode of said preionization unit via a conductive feedthrough which penetrates through said housing, wherein said electric circuit includes only one or more passive electrical components for damping electrical oscillations within said preionization electrode.

2. The discharge chamber of claim 1, wherein said one or more passive electrical components includes a resistor.

3. The discharge chamber of claim 2, wherein said resistor is connected to ground.

4. A discharge chamber for a gas arc-discharge laser, comprising:

a housing configured to hold a laser gas mixture;

a pair of opposed main arc-discharge electrodes within said housing defining a main arc-discharge region;

a set of peaking capacitors connected to at least one of the main arc-discharge electrodes for electrical pumping by arc discharge of the main arc-discharge region;

a corona-type preionization unit within said housing, the preionization unit and said one of the main arc-discharge electrodes are each coupled to said set of peaking capacitors which power both a main arc-discharge and a preionization discharge; and an electric circuit external to said housing and electrically connected to an electrode of said preionization unit via a conductive feedthrough which penetrates through said housing, and wherein said electric circuit includes one or more passive electrical components including one or more resistors for damping electrical oscillations within said preionization electrode, and wherein said one or more resistors have a resistance which is greater than or substantially equal to the wave impedance of the preionization electrode.

5. A discharge chamber for a gas arc-discharge laser, comprising:

a housing configured to hold a laser gas mixture;

a pair of opposed main arc-discharge electrodes within said housing defining a main arc-discharge region;

a set of peaking capacitors connected to at least one of the main arc-discharge electrodes for electrical pumping by arc discharge of the main arc-discharge region;

a corona-type preionization unit within said housing, the preionization unit and said one of the main arc-discharge electrodes are each coupled to said set of peaking capacitors which power both a main arc-discharge and a preionization discharge; and an electric circuit external to said housing and electrically connected to an electrode of said preionization unit via a conductive feedthrough which penetrates through said housing, and wherein said electric circuit includes one or more passive electrical components including one or more resistors for damping electrical oscillations within said preionization electrode, and wherein said one or more resistors have a resistance which is between 8 ohms and 70 ohms.

6. The discharge chamber of claim 5, wherein said resistor has a resistance which is between 30 ohms and 70 ohms.

7. A discharge chamber for a gas arc-discharge laser, comprising:

a housing configured to hold a laser gas mixture;

a pair of opposed main arc-discharge electrodes within said housing defining a main arc-discharge region;

a set of peaking capacitors connected to at least one of the main arc-discharge electrodes for electrical pumping by arc-discharge of the main arc-discharge region;

a corona-type preionization unit within said housing, the preionization unit and said one of the main arc-discharge electrodes are each coupled to said set of peaking capacitors which power both a main arc-discharge and a preionization discharge; and a circuit including only one or more passive electrical components electrically connected to an electrode of said preionization unit for damping electrical oscillations within said preionization electrode.

8. The discharge chamber of claim 7, wherein said one or more passive electrical components include a resistor.

9. The discharge chamber of claim 8, wherein said resistor is connected to ground.

10. A discharge chamber for a gas arc-discharge laser, comprising:

a housing configured to hold a laser gas mixture;

a pair of opposed main arc-discharge electrodes within said housing defining a main arc-discharge region;

a set of peaking capacitors connected to at least one of the main arc-discharge electrodes for electrical pumping by arc-discharge of the main arc-discharge region;

a corona-type preionization unit within said housing, the preionization unit and said one of the main arc-discharge electrodes are each coupled to said set of peaking capacitors which power both a main arc-discharge and a preionization discharge; and a circuit including one or more passive electrical components including one or more resistors electrically connected to an electrode of said preionization unit for damping electrical oscillations within said preionization electrode, wherein said one or more resistors have a resistance which is greater than or substantially equal to the wave impedance of the preionization electrode.

11. A discharge chamber for a gas arc-discharge laser, comprising:

a housing configured to hold a laser gas mixture;

a pair of opposed main arc-discharge electrodes within said housing defining a main arc-discharge region;

a set of peaking capacitors connected to at least one of the main arc-discharge electrodes for electrical pumping by arc-discharge of the main arc-discharge region;

a corona-type preionization unit within said housing, the preionization unit and said one of the main arc-discharge electrodes are each coupled to said set of peaking capacitors which power both a main arc-discharge and a preionization discharge; and a circuit including one or more passive electrical components including one or more resistors electrically connected to an electrode of said preionization unit for damping electrical oscillations within said preionization electrode, wherein said one or more resistors have a resistance which is between 8 ohms and 70 ohms.

12. The discharge chamber of claim 11, wherein said resistor has a resistance which is between 30 ohms and 70 ohms.

13. A discharge chamber for a gas arc-discharge laser, comprising:
- a housing configured to hold a laser gas mixture;
- a pair of opposed main arc-discharge electrodes within said housing defining a main arc-discharge region;
- a set of peaking capacitors connected to at least one of the main arc-discharge electrodes for electrical pumping of the main arc-discharge region;
- a corona-type preionization unit within said housing, the preionization unit and said one of the main arc-discharge electrodes are each coupled to said set of peaking capacitors which power both a main arc-discharge and a preionization discharge, peaking capacitors being the only active components connected to said preionization unit; and
- one or more resistors having a resistance at a value that is greater than or equal to the wave impedance of the preionization electrode and electrically connected to an electrode of said preionization unit for damping electrical oscillations within said internal electrode.

14. The discharge chamber of claim 13, wherein said one or more resistors are connected to ground.

15. A discharge chamber for a gas arc-discharge laser, comprising:
- a housing configured to hold a laser gas mixture;
- a pair of opposed main arc-discharge electrodes within said housing defining a main arc-discharge region;
- a set of peaking capacitors connected to at least one of the main arc-discharge electrodes for electrical pumping of the main arc-discharge region;
- a corona-type preionization unit within said housing, the preionization unit and said one of the main arc-discharge electrodes are each coupled to said set of peaking capacitors which power both a main arc-discharge and a preionization discharge; and
- one or more resistors having a resistance at a value that is greater than or equal to the wave impedance of the preionization electrode and electrically connected to an electrode of said preionization unit for damping electrical oscillations within said internal electrode,
- wherein the one or more resistors have a resistance value which is between 8 ohms and 70 ohms.

16. The discharge chamber of claim 15, wherein the one or more resistors have a resistance value which is between 30 ohms and 70 ohms.

17. A discharge chamber for a gas arc-discharge laser, comprising:
- a housing configured to hold a laser gas mixture;
- a pair of opposed main arc-discharge electrodes within said housing defining a main discharge region;
- a set of peaking capacitors connected to at least one of the main discharge electrodes for electrical pumping of the main arc-discharge region;
- a corona-type preionization unit within said housing, the preionization unit and said one of the main arc-discharge electrodes are each coupled to said set of peaking capacitors which power both a main arc-discharge and a preionization discharge, the set of peaking capacitors being the only active components connected to the preionization unit; and
- an electrical component electrically connected to an electrode of said preionization unit for damping electrical oscillation within said preionization electrode.

18. The discharge chamber of claim 17, wherein said electric circuit includes a passive electrical component for damping electrical oscillations within said preionization electrode.

19. The discharge chamber of claim 18, wherein said passive electrical component includes a resistor.

20. The discharge chamber of claim 19, wherein said resistor is connected to ground.

21. A discharge chamber for a gas arc-discharge laser, comprising:
- a housing configured to hold a laser gas mixture;
- a pair of opposed main arc-discharge electrodes within said housing defining a main discharge region;
- a set of peaking capacitors connected to at least one of the main discharge electrodes for electrical pumping of the main arc-discharge region;
- a corona-type preionization unit within said housing, the preionization unit and said one of the main arc-discharge electrodes are each coupled to said set of peaking capacitors which power both a main arc-discharge and a preionization discharge; and
- an electrical circuit including one or more resistors electrically connected to an electrode of said preionization unit for damping electrical oscillations within said preionization electrode,
- wherein said one or more resistors have a resistance which is greater than or substantially equal to the wave impedance of the preionization electrode.

22. A discharge chamber for a gas arc-discharge laser, comprising:
- a housing configured to hold a laser gas mixture;
- a pair of opposed main arc-discharge electrodes within said housing defining a main discharge region;
- a set of peaking capacitors connected to at least one of the main discharge electrodes for electrical pumping of the main arc-discharge region;
- a corona-type preionization unit within said housing, the preionization unit and said one of the main arc-discharge electrodes are each coupled to said set of peaking capacitors which power both a main arc-discharge and a preionization discharge; and
- an electrical circuit including one or more resistors electrically connected to an electrode of said preionization unit for damping electrical oscillations within said preionization electrode,
- wherein said one or more resistors have a resistance which is between 8 ohms and 70 ohms.

23. The discharge chamber of claim 22, wherein said one or more resistors have a resistance which is between 30 ohms and 70 ohms.

24. The discharge chamber of claim 17, wherein the gas discharge laser is one of an excimer laser and a $F_2$-laser.

* * * * *